United States Patent [19]

Tanaka et al.

[11] Patent Number: 5,290,899

[45] Date of Patent: Mar. 1, 1994

[54] PHOTOSENSITIVE MATERIAL HAVING A SILICON-CONTAINING POLYMER

[75] Inventors: Akinobu Tanaka, Atsugi; Masazumi Hasegawa, Shin Nanyo, both of Japan

[73] Assignees: Tosoh Corporation, Yamaguchi; Nippon Telegraph and Telephone Corporation, Tokyo, both of Japan

[21] Appl. No.: 952,140

[22] Filed: Sep. 28, 1992

Related U.S. Application Data

[60] Continuation of Ser. No. 714,420, Jun. 12, 1991, abandoned, which is a division of Ser. No. 410,573, Sep. 21, 1989, Pat. No. 5,057,396.

[30] Foreign Application Priority Data

Sep. 22, 1988 [JP] Japan .................. 63-236299

[51] Int. Cl.$^5$ .............................. C08G 77/12
[52] U.S. Cl. .............................. 528/15; 528/16; 528/23; 528/37; 528/42; 528/43
[58] Field of Search .............. 528/37, 15, 16, 23, 528/43, 42

[56] References Cited

U.S. PATENT DOCUMENTS

| | | | |
|---|---|---|---|
| 2,386,466 | 10/1945 | Hyde | 174/121 |
| 3,297,632 | 1/1967 | Wu | 528/37 |
| 4,069,178 | 1/1978 | Mikami et al. | 260/22 |

FOREIGN PATENT DOCUMENTS

| | | |
|---|---|---|
| 064598 | 5/1985 | European Pat. Off. |
| 0246169 | 11/1987 | European Pat. Off. |
| 59-125730 | 11/1984 | Japan |
| 60-254034 | 5/1986 | Japan |

*Primary Examiner*—Melvyn I. Marquis
*Attorney, Agent, or Firm*—Sughrue, Mion, Zinn, Macpeak & Seas

[57] ABSTRACT

A silicon-containing polymer comprising repeating units of silicon-containing cyclic compound, represented by a general formula (I)

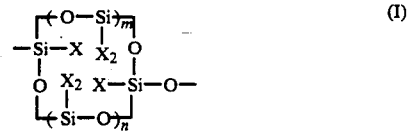

(wherein m and n are zero or a positive integer, respectively, however $m+n>0$, and X is any of an alkyl group, alkoxy group, phenyl group, naphthyl group, substituted phenyl group and substituted naphthyl group or a mixture of these, and the substituent of said substituted phenyl group or substituted naphthyl group indicates any of halogen atom, halogenated alkyl group, amino group, aminoalkyl group and nitro group or a mixture of these), and a photosensitive material containing said silicon-containing polymer are disclosed.

1 Claim, 2 Drawing Sheets

29Si-NMR chart of hexaphenylcyclotrisiloxane

FD-MS chart

29Si-NMR chart said polymer

13C-NMR chart of said polymer

PHOTOSENSITIVE MATERIAL HAVING A SILICON-CONTAINING POLYMER

This is a continuation of application Ser. No. 07/714,420 filed Jun. 12, 1991, now abandoned, which is a divisional of application Ser. No. 07/410,573, filed Sep. 21, 1989, which issued as U.S. Pat. No. 5,057,396 on Oct. 15, 1991.

BACKGROUND OF THE INVENTION

The present invention relates to a novel silicon-containing polymer and a novel photosensitive material containing siloxane linkages, which is useful for resist having photosensitive groups responsive to electrons, X-rays, UV light and deep UV light as are used when producing semiconductor integrated circuits, and which is also usable as an insulation film or a protective film.

The silicon-containing polymers are used in a variety of fields for the reasons that they exhibit excellent heat resistance and cold resistance, that the electric characteristics thereof are stable over a wide range of temperature, and the like. Moreover, silicon-based polymers provided with photosensitive group have been recently developed and their uses are spreading out in electronic materials.

In the electronic field, particularly in the production of semiconductors (integrated circuits), the processing of substrates at high levels of precision has become more complicated and higher precision has been required as the degree of circuit integration has become higher. Accompanying this, techniques for performing processing at a sub-micron scale on substrates at different levels have been proposed and various methods have been tried. As one of them, a two-layer resist technique using a silicon-based resist as a top layer has been proposed, and has recently received much attention. This technique will now be explained.

A resin or resist having resistance to halogen gas is spin-coated onto a bottom layer, which is subject to soft- or hard-baking. Then, a silicon-based resist is spin-coated onto the top layer. Using an exposure device, the top layer resist is exposed to light and only the top layer is developed. Then, using the patterned area of the top layer resist as a mask, the bottom layer resist is etched with $O_2$ gas plasma. Finally, using the bottom layer resist as a mask, the substrate is etched with halogen gas.

The functions needed for the top layer resist are as follows:

(1) To be excellent in resistance to $O_2$ plasma.
(2) To be excellent in flatness.
(3) To have a high glass transition temperature.
(4) To have high resolution.
(5) To have high sensitivity.

Silicon-containing resist materials are excellent in resistance to $O_2$ plasma and some resist materials using them are known. As representatives thereof, a method of attaching a silyl group directly or indirectly to the benzene rings of Novolak resin or polystyrene, a method utilizing a polysilane linkage, and, in particular, recently, a method utilizing a ladder polymer (silsesquioxane linkage) have been proposed.

In the case of the type where a silyl group is attached directly or indirectly to the benzene rings, however, the problem that the resistance to $O_2$ plasma is insufficient exists because the content of Si is low and Si is introduced into a side chain. Moreover, in the case of the polysilane type, poor coating property and stability are generally encountered, though the content of Si may be increased depending on the kind of compounds. Furthermore, in the case of silsesquioxane type polymers, there is a problem that the sensitivity is not enough though the resistance to $O_2$ plasma is excellent.

As described above, at present resist materials with excellent resistance to $O_2$ plasma and excellent flatness which have a high Tg, high resolution and high sensitivity have not been developed.

The present invention was made to overcome the problems as above and the purpose thereof is to provide a novel silicon-containing polymer and a photosensitive material using the same which is excellent in resistance to $O_2$ plasma, has excellent flatness and which has high Tg, high resolution and high sensitivity.

As a result of diligent studies against such background, the inventors have found that by using a polymer having a single siloxane cyclic compound as a repeating unit or a copolymer having various siloxane cyclic compounds as repeating units, a resist material which is highly sensitive, highly flat and excellent in resistance to $O_2$ plasma and yet having a high Tg can be obtained, leading to the completion of the present invention.

SUMMARY OF THE INVENTION

Said silicon-containing polymer comprising repeating units of silicon-containing cyclic compound is represented by a general formula (I).

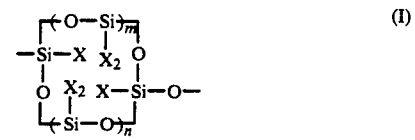

(wherein m and n are positive integers including 0, respectively, however m+n>0, and X can be an alkyl group, alkoxy group, phenyl group, naphthyl group, substituted phenyl group and substituted naphthyl group or a mixture of these, and the substituent of said substituted phenyl group or substituted naphthyl group can be a halogen atom, halogenated alkyl group, amino group, aminoalkyl group and nitro group or a mixture of these).

DETAILED DESCRIPTION OF THE INVENTION

Figure 1:
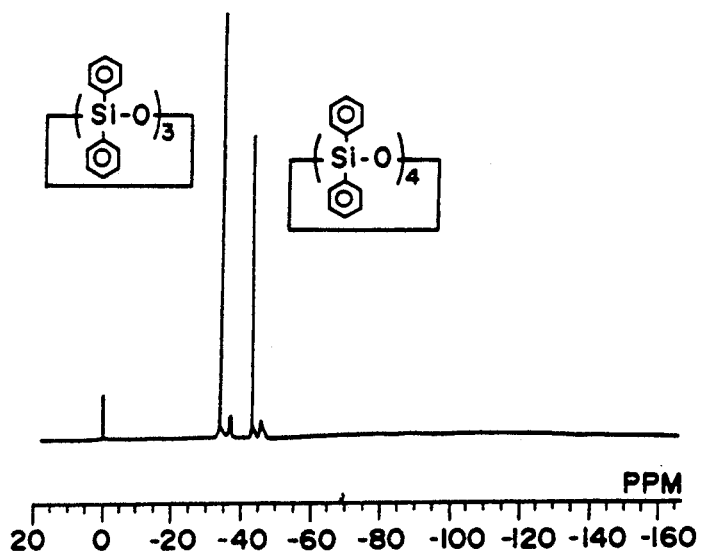
FIG. 1 shows a $^{29}$Si-NMR chart of hexaphenylcyclotrisiloxane being a starting raw material in Production example 2 of the invention.

The alkyl group being X in the general formula (I) is not particularly restricted. In the case of straight alkyl, however, it is each group of, for example, methyl, ethyl, propyl, butyl, pentyl, hexyl, octyl, decyl, dodecyl, vinyl, propenyl, butenyl, pentenyl, hexenyl, octenyl, decenyl, dodecenyl, or the like, and, in the case of branched alkyl, it is each group of, for example, sec-propyl, sec-butyl, t-butyl, 2-methylpropyl, 2-methylbutyl, neopentyl, 1-methylpentyl, 2-methylpentyl, 4-methylpentyl, 2-ethylhexyl or the like. Part of the hydrogens in said alkyl group may be substituted by a halogen atom such as F, Cl, Br or I and/or by phenyl, naphthyl, substituted phenyl or substituted naphthyl group. As a substituent in said substituted phenyl or substituted naphthyl, for example, chlorine, fluorine, bromine, nitro group, alkyl group, amino group or the like can be mentioned. Moreover, in the case of cyclic alkyl, each group of cyclopropyl, cyclopropenyl, cyclobutyl, cyclobutenyl, cyclopentyl, cyclopentenyl, cyclohexyl, cyclohexenyl, cyclooctyl, cyclooctenyl or the like can be mentioned. Moreover, also when X is an alkoxy group, this is not particularly restricted and, for example, methoxy, ethoxy, propoxy, butoxy, pentoxy, phenoxy or the like can be mentioned.

Since the resist material of the invention has a siloxane structure containing an Si group on the main chain of the polymer and the content of Si is also high, it is very high in resistance to $O_2$ plasma and further, because of the cyclic ring structure, it has a high Tg. Of course, when a higher Tg is desired, such can easily be obtained by introducing a phenyl group or naphthyl group to the side chain of the Si group.

As the methods to impart photosensitivity, there is a method where one allows an Si group or a side chain of an Si group in the polymer of the invention to have introduced a photosensitive group, for example, halogenated alkyl group, aminoalkyl group or the like, or a method which involves adding a photosensitive agent to the polymer of the invention.

For the method of producing the siloxane polymer of the invention represented by the general formula (I), there are two ways to start from the monomer and cyclic ring. For example, when starting from a monomer, following the reactions are utilized.

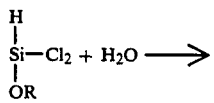

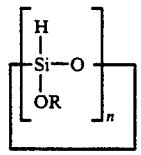

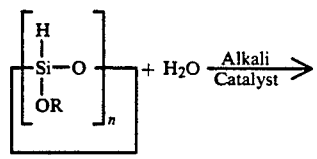

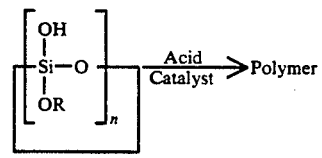

(R: Arbitrary substituent, n: Positive integer)

Moreover, when starting from a cyclic ring, the rearrangement due to a Lewis acid or the dissociation reaction of Si-C is utilized. For example,

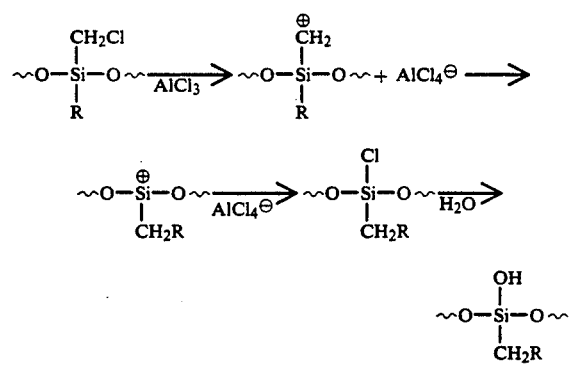

successively, using the reaction $2SiOH \rightarrow Si-O-Si$, the polymerization is contemplated (R: arbitrary substituent).

Furthermore, when using a cyclic ring containing a phenyl group as a starting raw material, the following reaction is utilized.

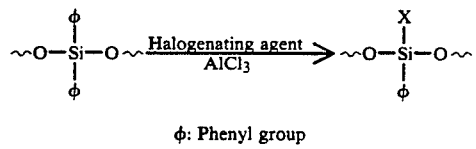

$\phi$: Phenyl group

In succession, $H_2O$ or alcohol is allowed to react to convert to SiOH or SiOR' (R': arbitrary substituent). As a halogenating agent to be used here, acids such as H-Hal (Hal: halogen atom), $Hal_2$, alkyl halide, thionyl halide, sulfonyl halide or the like can be mentioned.

By adding the photosensitive agent to or introducing the photosensitive group into the polymer of the invention produced utilizing the reactions aforementioned, the polymer becomes usable as a photosensitive material.

For introducing the photosensitive group, there is a method of making a cyclic ring using a compound which can become the photosensitive group, for example, an Si compound having double bond such as $H_2C=CH-CH_2-Si$ for the side chain of Si. Or, after produced the polymer of the invention, the photosensitive group may be introduced into the side chain of an Si compound or the photosensitive agent may be added. Further, if necessary, coupling of SiOH or SiOR'' (R'': alkyl group or phenyl group) contained in the polymer of the invention may be conducted with a silane coupling agent. Still more, if need be, a crosslinking agent, sensitizer or the like as are commonly used may be added.

In the following, the invention will be illustrated in more detail based on examples, but the invention is not confined to these.

PRODUCTION EXAMPLE 1

To 100 g of ether cooled with ice were added 10 g of $\phi SiHCl_2$. Then, a small amount of hydrochloric acid (35% aqueous solution) and 50 g of chloromethyl methyl ether were added under stirring and the mixture was stirred for about 30 minutes under cooling with ice. After the completion of reaction, said reaction product was added dropwise into a large amount of methanol solution to produce precipitates. Two peaks were recognized on analyzing the precipitates with silicon NMR. When fractionating with GPC to analyze, these precipitates were confirmed to be a mixture of two kinds of compounds, i.e., trisilylcyclosiloxane and tetrasilylcyclosiloxane. Then, 5 g of these precipitates were dissolved into 100 g of THF (tetrahydrofuran) solution containing approximately 0.5% by weight of water and triethylamine was added in a small amount, and the system violently stirred. Thereafter, the reaction liquor was added dropwise into benzene to precipitate the cyclosiloxane compound. Upon taking an H-NMR of these precipitates, a peak originating from SiOH was identified. Successively, for the chloromethylation, 5 g of the precipitates previously obtained were added into a solution of 100 g of methylal and 8 g of thionyl chloride, which was adjusted to $-20°$ C. while stirring. Then, a Lewis acid (e.g., $FeCl_3$) was added in small amount to allow the polymerization reaction and the chloromethylating reaction to progress concurrently. After reaction for about 20 hours, this reaction product was added dropwise into a large amount of solution at $0°$ C. comprising methanol and water (1:1) to precipitate the polymer. Upon determining the molecular weight after drying, it was found to be $MW \approx 10000$ (in terms of polystyrene) and the content of Cl was 4.1% by weight.

EXAMPLE 1

To 45 g of DIBK (dibutyl ketone) were added 5 g of polymer in Production example 1, which was sufficiently stirred and completely dissolved. Then, this was filtered through a 0.2 μm filter to make up a resist solution. Following this, OFPR-800 (photoresist made by Tokyo Oka Co.) was coated onto a 3 in. silicon substrate so the thickness become 1 μm, which was baked for about 30 minutes at $200°$ C. in an oven. After baking, said resist solution was coated while adjusting the number of revolutions of a spin coater so the thickness become 0.2 μm. After baking again for 20 minutes at $80°$ C., exposure was done with an electron ray exposure device. Next, development was performed with a solution of 1-methoxy-2-propanol/di-n-butyl ether=5/2. The sensitivity at this time was 12 μC/cm$^2$ at an area where the rate of residual resist film was 50%. Successively, etching with $O_2$ gas was performed by the use of dry a etching device (RIE).

| Etching conditions: | |
|---|---|
| Gas flow rate | 40 SCCM |
| RF power | 125 W |
| $O_2$ pressure | 40 m Torr |
| Etching speed | |
| Resist of the invention | 30 Å/min |
| OFPR-800 | 2000 Å/min |

As above, the resist of the invention was confirmed to be excellent in resistance to $O_2$ plasma. When measuring the resolution with electron an microscope, a gap pattern with a line width of 3 μm and a space width of 0.2 μm was resolved distinctly.

EXAMPLE 2

The resist prepared in Example 1 was spin-coated onto a silicon wafer while adjusting the number of revolutions so the thickness become 0.35 μm. Thereafter, this was baked for 20 minutes at $80°$ C. in an oven and drawing and development were made by the same technique as that in Example 1. Thereafter, when baking for 30 minutes at $80°$ C. or $160°$ C., the line width of the pattern was not changed at either temperature. That is to say, it could be confirmed that the flow of resist did not take place even if baking at high temperature.

PRODUCTION EXAMPLE 2

To 80 g of methylal were added 6 g of commercial hexaphenylcyclotrisiloxane (When determining with silicon NMR, two peaks were detected at 33–34 ppm and 43 ppm (see FIG. 1). Upon conducting FD-MS measurement (electrolytically eliminated ion-mass spectrum), this was confirmed to be a mixture of a compound with a mass of 594 originating from hexaphenylcyclotrisiloxane and that with a mass of 792 originating from octaphenylcyclotetrasiloxane). Further, after adding 10 g of thionyl chloride, the mixture was sufficiently stirred and the temperature of the solution was adjusted so as to become $-20°$ C. Next, a small amount of $FeCl_3$ catalyst was added to concurrently cause the polymerization and the chloromethylating reaction to proceed over a period of 20 hours. After the completion of reaction, this reaction product was added dropwise into a solution of methanol:water=1:1 to precipitate the polymer. Upon measuring the molecular weight with GPC after drying, this was found to be $MW=39000$ and the content of Cl was 6.8% by weight.

Figure 2:
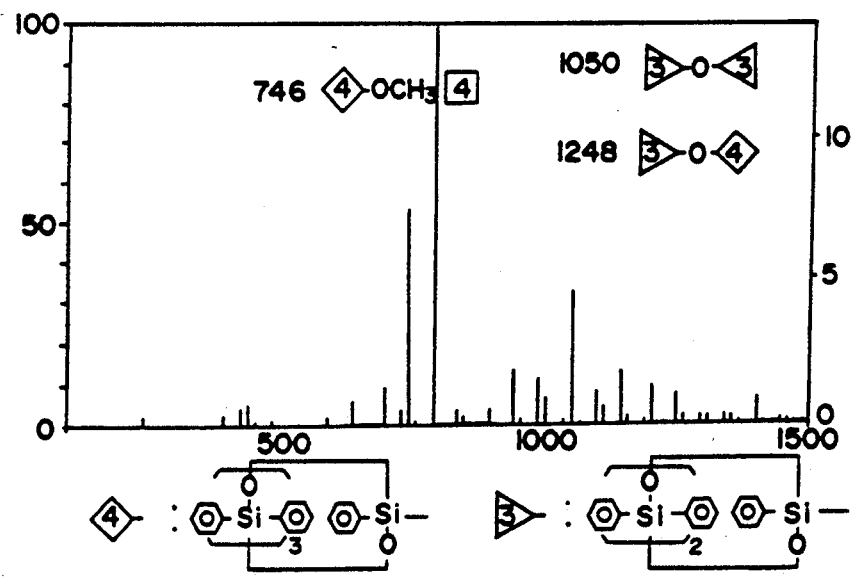
FIG. 2 shows a FD-MS chart of the product at 10 minutes after the initiation of polymerization reaction in the same Production example 2.
Figure 3:
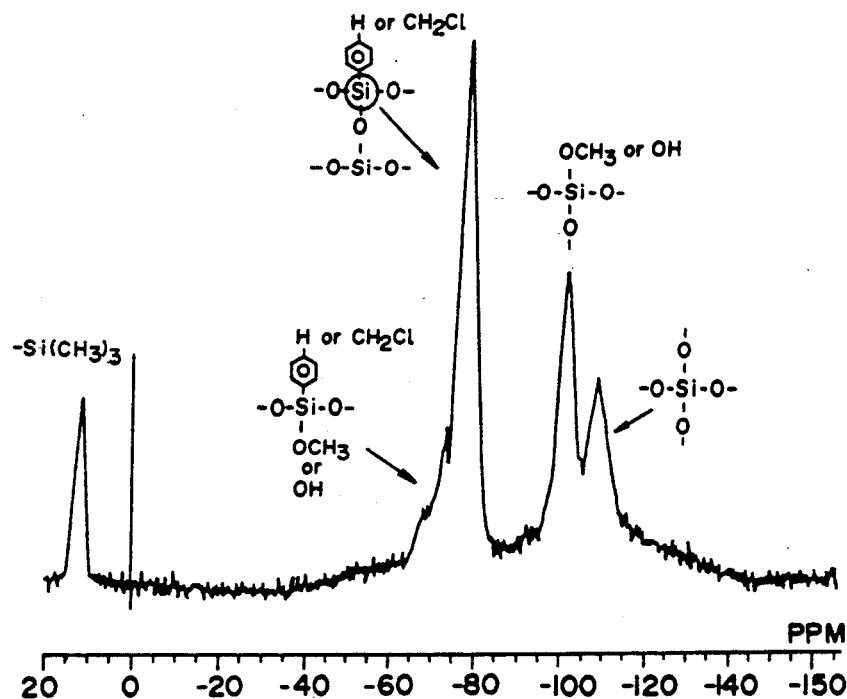
FIG. 3 and FIG. 4 show a $^{29}$Si-NMR chart and a $^{13}$C-NMR chart of product, respectively, after the completion of polymerization reaction in the same Production example 2.
Figure 4:
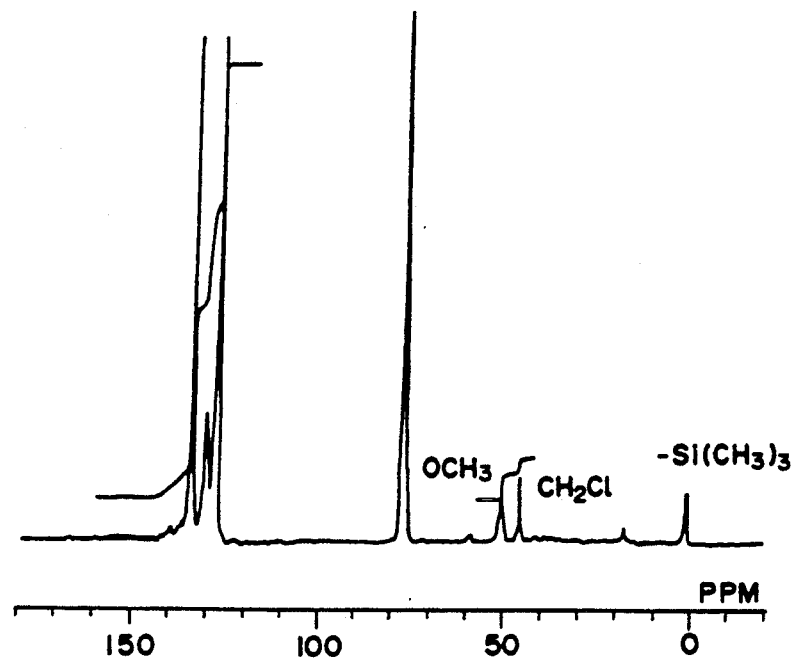

In this polymerization procedure, sampling was made at 10 minutes after the addition of catalyst to conduct FD-MS measurement. Results are shown in FIG. 2. Further, results of silicon NMR, $^{13}C$-NMR and elemental analysis of a sample after the completion of reaction are shown in FIG. 3, FIG. 4 and Table 1, respectively.

From the results of analysis above, the structure of the present polymer is assumed as follows:

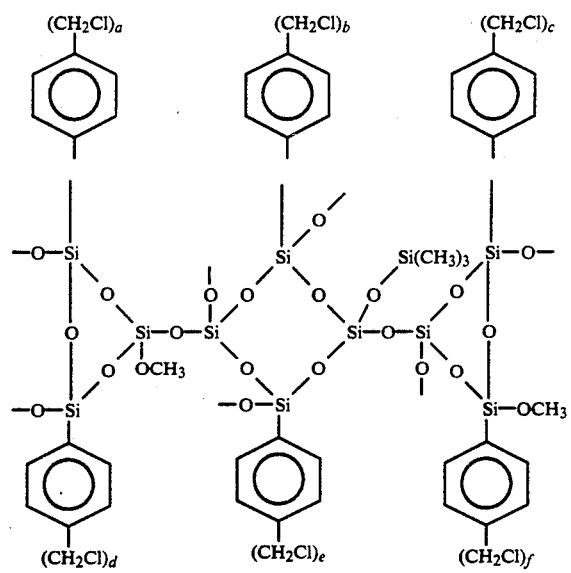

$a + b + c + d + e + f = 2$ or $3$

TABLE 1

| | Results of elemental analysis | | | |
|---|---|---|---|---|
| | C | H | Si | Cl |
| Polymer | 42.7% | 3.6% | 24.7% | 6.8% |

EXAMPLE 3

Except that 3.5 g of polymer in Production example 2 were dissolved into 48 g of DIBK, entirely same procedure was used as in Example 1 and 2.

Sensitivity

Very high sensitivity was obtained as proved at a 50% rate of residual film=2.8 $\mu C/cm^2$.

Etching speed

Resist of the invention: 20 Å/min

OFPR-800: 2000 Å/min

Resolution

Distinct gap pattern of L/S=3 $\mu m/0.2$ $\mu m$ was obtained.

Test for heat resistance

Even when post-baking was performed for 30 minutes at 80° C. or 180° C., the line width of the pattern was not changed.

EXAMPLE 4

Into 45 g of DIBK were dissolved 3.5 g of the resin of Production example 2 and 1.2 g of 4,4'-diazidobenzophenone, which was filtered through a 0.2 $\mu m$ filter to obtain a resist solution.

OFPR-800 was coated onto a wafer (3 in.) so the film thickness became 1.2 $\mu m$, which was baked for 30 minutes at 200° C. Next, the resist of the invention was coated at 0.2 $\mu m$. Closely contacting exposure was conducted using PLA-521F (deep UV light). Thereafter, etching was performed under the same conditions as in Example 1.

Sensitivity

Very high sensitivity was confirmed also to the deep UV light as proven by a 70% rate of residual film=2.2 L. I.

Etching speed

Resist of the invention: 25 Å/min

OFPR-800: 2000 Å/min

As above, the resist of the invention was confirmed to have sufficient resistance to $O_2$ even when adding a photocrosslinking agent.

Resolution

Distinct pattern of L/S=0.5 $\mu m/0.5$ $\mu m$ was obtained.

As illustrated above, the photosensitive material using the novel silicon-containing polymer having a silicon-containing cyclic compound as a repeating unit in accordance with the invention is very highly sensitive to electrons, X-rays, deep UV light and UV light. Moreover, it has high etching resistance to $O_2$ because the main chain has a siloxane linkage and the content of Si is high, and it is also excellent in the heat resistance because of cyclic ring, and further it has high resolution. It is therefore suitable for the production of semiconductor integrated circuit elements such as super LSI.

What is claimed is:

1. A silicon-containing polymer comprising repeating units of silicon-containing cyclic compound, represented by general formula (I)

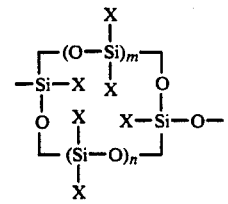

wherein each of m and n is zero or a positive integer however m+n>0, and X is selected from the group consisting of an alkyl group, alkoxy group, phenyl group, naphthyl group, substituted phenyl group and substituted naphthyl group, wherein the substituent of said substituted phenyl group or substituted naphthyl group is selected from the group consisting of a halogen atom, halogenated alkyl group, amino group, aminoalkyl group and nitro group, wherein the X groups may be the same or different, and wherein said silicon-containing polymer comprises at least two kinds of repeating units having different values of (m+n) within the range of (m+n) being 1 to 4 in one polymer.

* * * * *